United States Patent [19]

Watanuki

[11] Patent Number: 5,258,808
[45] Date of Patent: Nov. 2, 1993

[54] EXPOSURE APPARATUS FOR FORMING IMAGE

[75] Inventor: Minoru Watanuki, Tokyo, Japan

[73] Assignee: ORC Manufacturing Co., Ltd., Tokyo, Japan

[21] Appl. No.: 925,753

[22] Filed: Aug. 7, 1992

[30] Foreign Application Priority Data

Aug. 28, 1991 [JP] Japan .................................. 3-217198

[51] Int. Cl.$^5$ .............................................. G03B 27/04
[52] U.S. Cl. ........................................ 355/89; 355/26
[58] Field of Search ................................. 355/26, 89

[56] References Cited

U.S. PATENT DOCUMENTS

| 3,734,616 | 5/1973 | Mayhew et al. | 355/89 |
| 3,877,808 | 4/1975 | Jasperson, Jr. | 355/89 X |
| 4,389,115 | 6/1983 | Richter | 355/26 |
| 4,571,073 | 2/1986 | Diedrich et al. | 355/89 |
| 4,614,425 | 9/1986 | Copeland et al. | 355/26 X |
| 4,666,294 | 5/1987 | Gelbert et al. | 355/89 |
| 4,721,980 | 1/1988 | Yazaki | 355/89 |
| 4,764,791 | 8/1988 | Omata et al. | 355/26 |
| 5,037,722 | 8/1991 | Watanuki | 430/319 |
| 5,147,760 | 9/1992 | Hoshinouchi | 430/296 |
| 5,185,625 | 2/1993 | Abe et al. | 355/26 |

FOREIGN PATENT DOCUMENTS 3340653  5/1985  Fed. Rep. of Germany .
4022165  1/1991  Fed. Rep. of Germany .
2-254455 10/1990 Japan .

OTHER PUBLICATIONS

Patent Abstracts of Japan; vol. 11, No. 40 (P-544) 5 Feb. 1987; Toshiba Corp.; JP-A-61 210 360.

Primary Examiner—Richard A. Wintercorn
Attorney, Agent, or Firm—Longacre & White

[57] ABSTRACT

An appropriate photochemical reaction is produced in electrodeposited photoresist applied to the surface of a board and to the inner wall surfaces of holes extending through the board, for improving the efficiency of the operation of image formation. Upper and lower ultraviolet illumination devices and upper and lower light condensers 34a, 34b are provided. Each ultraviolet illumination device has a discharge lamp 32 and a reflecting mirror 33. Each light condenser consists of a horizontal array of a multiplicity of lenses 35 placed close to each other. The upper and lower ultraviolet illumination devices are disposed respectively above and below the board 31 in a symmetrical relation with respect to the board. The upper light condenser 34a is disposed between the upper discharge lamp 32 and the board 31, while the lower light condenser 34b is located between the lower discharge lamp 32 and the board 31. These light condenser which are spaced from each other can be moved horizontally. The lenses 35 are optically arranged in such a way that ultraviolet rays passed through the lenses 35 form conical outgoing light surrounding the optical axes of the lenses.

1 Claim, 12 Drawing Sheets

EXPOSURE APPARATUS FOR FORMING IMAGE

DETAILED DESCRIPTION OF THE INVENTION

1. Industrial Field of Utilization

The present invention relates to an exposure apparatus adequate to photolithographically create an image on the surface of a board having holes extending therethrough and, more particularly, to an exposure apparatus which is used for creating an image and which induces an adequate photochemical reaction in photoresist electrodeposited on the surface of the board and on the inner wall surfaces of the holes.

2. Prior Art Techniques

Figure 12:
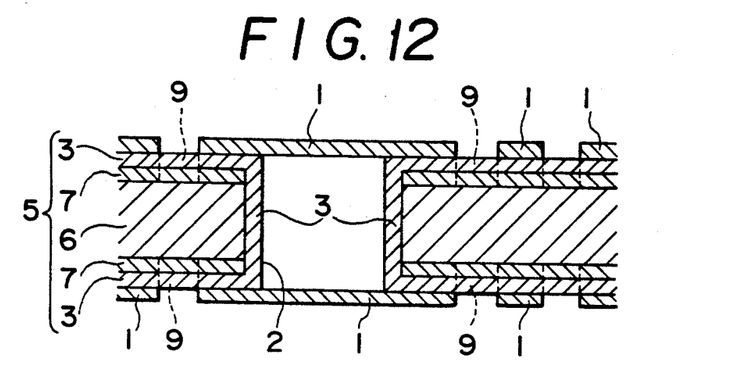
FIG. 12 is a view illustrating a conventional method (tenting method) of protecting the copper-plated layer on the inner wall surface of each hole.
Figure 13:
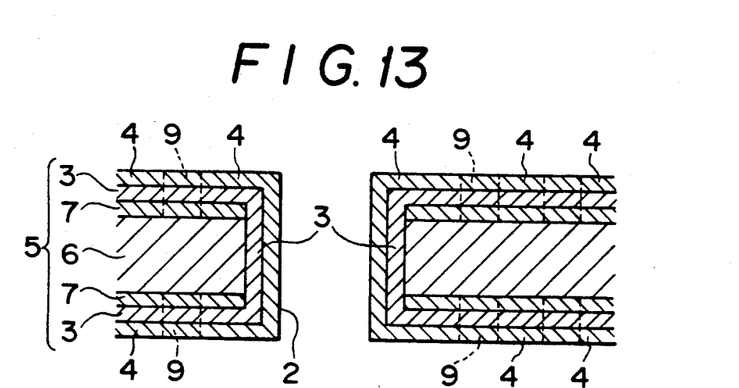
FIG. 13 is a view illustrating another conventional method (solder/throughhole method) of protecting the copper-plated layer on the inner wall surface of each hole.

In a conventional image formation process, patterns are formed photolithographically on both surfaces of a printed-wiring board having holes extending through it, and then the formed patterns are electrically connected together via copper-plated layers formed on the inner walls of the holes. In this process, in order to protect the copper-plated layers against the etching, any one of the following means has been adopted: (1) The surface of the board is coated with a dry film. As shown in FIG. 12, the openings of the holes 2 are closed by a thin film 1 of a resist which is hardened by irradiation of light. This method is known as the tenting method. (2) After exposure and development, the exposed surfaces of the copper-plated layers 3 are plated with solder 4 as shown in FIG. 13. This method is known as the solder-/throughhole method. In this way, cumbersome operations are necessary prior to the etching. In the figures, a board 5 is a copper-clad laminate. Indicated by 6 is an insulating substrate. Indicated by 7 is copper foil. Those portions 9 which are partitioned by the broken lines are removed by the etching.

Figure 14:
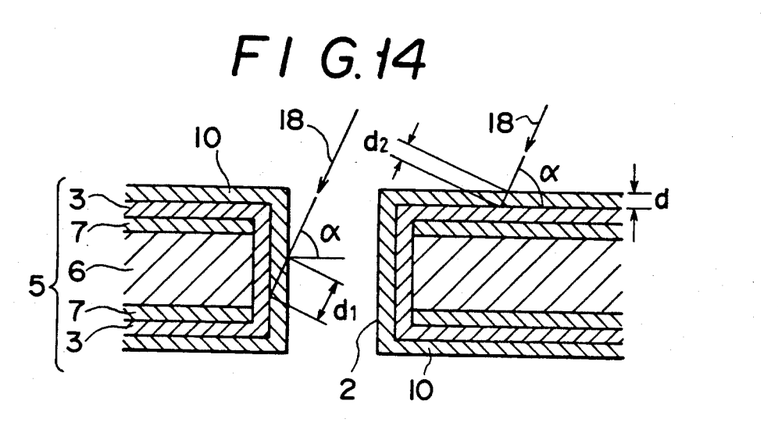
FIG. 14 is a view illustrating a further conventional method (formation of coating, using electrodeposited photoresist) of protecting the copper-plated layer on the inner wall surface of each hole.

In order to solve the foregoing problems, the present applicant has already proposed a novel exposure apparatus in Japanese Patent Laid-Open No. 254455/1990. As shown in FIG. 14, photoresist 10 which is a photosensitive resin capable of electroplating is electrodeposited on the surface of the board 5 and on the inner wall surfaces of the holes 2. The photoresist 10 inside the holes 2 is hardened by ultraviolet rays for forming an image. In this way, the copper-plated layer 3 is protected.

Figure 15:
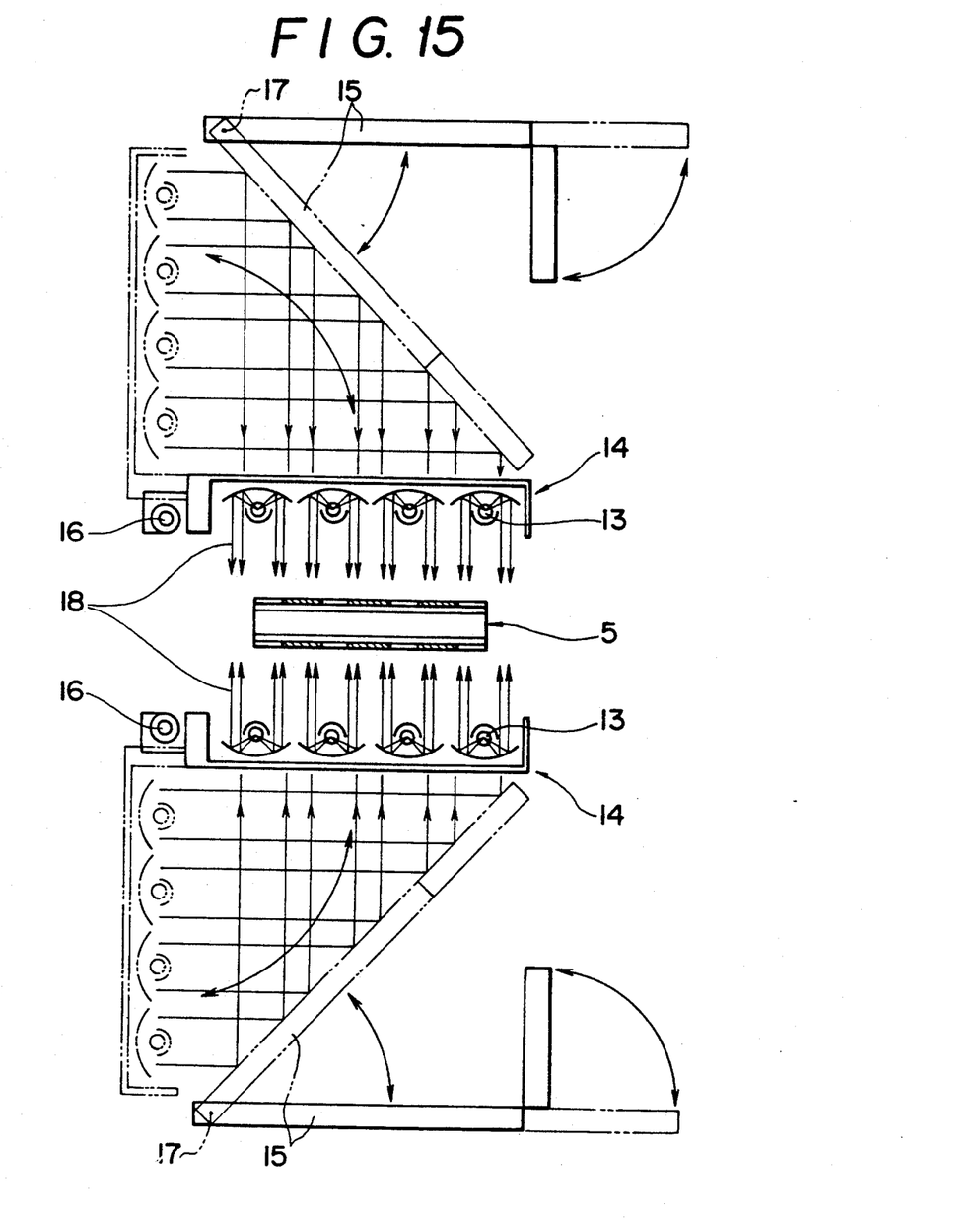
FIG. 15 is a side elevation in cross section, illustrating the operation of a conventional exposure apparatus.

As shown in FIG. 15, this apparatus comprises light source devices 14 each consisting of plural ultraviolet lamps 13 and foldable reflecting plane mirrors 15. These mirrors 15 are mounted so as to be rotatable about axes 16 and 17, respectively, which extend parallel to the board 5. When the light source devices 14 are placed close to the board 5 and horizontally as indicated by the solid lines, the light source devices emit ultraviolet rays to harden the photoresist inside the holes. When the light source devices 14 then arrive at raised positions at which they are perpendicular to the board 5 as indicated by the phantom lines, the light source devices emit ultraviolet rays via the reflecting plane mirrors 15, thus hardening the photoresist on the surface of the board.

In this apparatus, the copper-plated layers 3 inside the holes are protected by the hardened photoresist. Therefore, the aforementioned cumbersome pretreatments are dispensed with. Also, the light source devices 14 can be used for the pattern formation and also for the protection of the holes. Consequently, the exposure can be effected with the single apparatus.

However, the above-described exposure apparatus has room for improvements as described below.

When the inside of each hole is exposed, the ultra-violet rays 18 enter the hole at right angles or at substantially right angles to the board 5. As described later, the intensity of the ultraviolet rays exposing the inside of each hole is much intense than the intensity of ultraviolet rays used to expose the board surface.

Accordingly, when the inside of each hole is exposed, a mask (not shown) is placed on the photoresist 10 overlying the board surface. When the board surface is next exposed, the mask is removed and then the surface must be exposed via image formation film. This impedes the progress of the exposure operation.

The relationship between the incident angle of the ultraviolet rays and the intensity of the ultraviolet rays acting to harden the photoresist is next described. As shown in FIG. 14, when the ultraviolet rays 18 enter the board 5 at an angle of $\alpha$ to the board 5 with the photoresist 10 having a thickness of d, the amount of exposure which is given by equation (1) below must be enough to harden the photoresist 10 of the thickness $d_1$ in the holes. At the surface of the board, the amount of exposure which is given by equation (2) below must be enough to harden the photoresist 10 of the thickness $d_2$. The ratio of the amounts of exposure $d_1/d_2$ is given by $\tan\alpha$.

$$d_1 = d/\cos\alpha \tag{1}$$

$$d_1 = d/\sin\alpha \tag{2}$$

If $\alpha = 85$ degrees, the ratio of the amounts of exposure is $d_1/d_2 \approx 11$. It can be seen that intense ultraviolet radiation is needed to exposure the inside of each hole. When $\alpha = 70$ degrees, $d_1/d_2 \approx 2.74$. We observe that the value of $d_1/d_2$ varies greatly with the angle of tilt.

With the apparatus shown in FIG. 15, a plurality of ultraviolet lamps are needed to cause the ultraviolet rays 18 to enter the holes around the board. Therefore, there arises another problem that the amount of electric power consumed by the light source devices increases.

Figure 16:
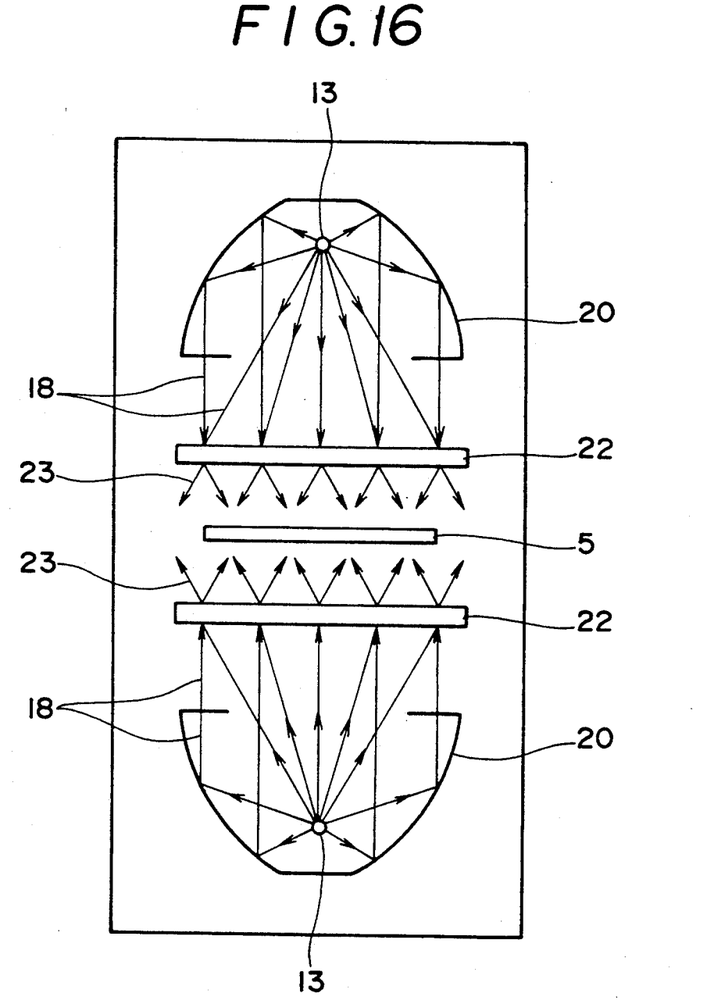
FIG. 16 is a side elevation in cross section, illustrating the operation of another conventional exposure apparatus.

To solve the foregoing problems, an exposure apparatus as shown in FIG. 16 has been earnestly investigated. In particular, this apparatus has an upper and a lower ultraviolet illumination devices. Each illumination device comprises a single discharge lamp 13 and a reflecting mirror 20. A transparent object 22 consisting of ground glass is disposed midway between each illuminating device and a board 5 such that these two transparent objects 22 are arranged vertically symmetrically. Nondirectional, substantially uniform light 23 is transmitted through the transparent objects 22 and scattered and then impinges on the whole surface of the board 5, thus exposing the electrodeposited photoresist on the surface of the board and the electrodeposited photoresist in the holes simultaneously.

After conducting various investigations, the apparatus of this kind has been forced to be abandoned for the following reasons.

(1) The intensity of the light 23 transmitted through the transparent objects 22 is weaker than expected and so it takes long to harden the resist inside the holes. Therefore, the heating action of the infrared rays contained in the illuminating light peels off the photoresist, or the photo-resist is hardened insufficiently, so that the photoresist is lost during the development.

(2) If the output power of the discharge lamps 13 is increased to appropriately expose the photoresist inside the holes, then the photoresist on the surface of the board hardens excessively. As a result, it is difficult to remove the resist at the time of the development and after the etching.

In view of the foregoing problems, it is an object of the present invention to provide an exposure apparatus which is used for formation of an image and which produces an adequate photochemical reaction in electrodeposited photoresist on the surface of a board and on the inner wall surfaces of holes extending through the board to prevent the quality of the finished product from deteriorating due to excessive or insufficient exposure, and permits the exposure operation to progress smoothly, thereby improving the efficiency of the image formation operation.

SUMMARY OF THE INVENTION

The above-described problem is solved by an exposure apparatus adapted to create an image on the surface of a board by directing ultraviolet radiation to the board via film used for creating an image and causing a photochemical reaction in electrodeposited photoresist on the surface of the board and on the inner wall surfaces of holes extending through the board, said apparatus comprising: an upper ultraviolet illumination device having a discharge lamp and a reflecting mirror and located above the board; a lower ultraviolet illumination device having a discharge lamp and a reflecting mirror and located below the board, the upper and lower ultraviolet illumination devices being spaced apart from each other vertically in a symmetrical relation; a horizontally movable upper light condenser consisting of a horizontal array of a number of lenses placed close to each other, the upper light condenser being located between the discharge lamp of the upper ultraviolet illumination device and the board; a horizontally movable lower light condenser consisting of a horizontal array of a number of lenses placed close to each other, the lower light condenser being located between the discharge lamp of the lower ultraviolet illumination device and the board, the lower light condenser being spaced from the upper light condenser; the lenses being optically arranged in such a way that the ultraviolet radiation incident on the lenses forms conical outgoing light surrounding the optical axes of the lenses.

(1) The conical light passed through the lenses enter the board from obliquely above and below at a given angle or at various angles close to it. Therefore, it is possible to appropriately harden the electrodeposited photoresist on the surface of the board and in the holes without excessive or insufficient exposure.

(2) If the light condensers are moved horizontally, the electrodeposited photoresist on the whole surface of the board and in the holes can be totally hardened.

(3) As a result of (1) and (2) above, the electrodeposited photoresist on the surface of the board and in the holes can be exposed continuously. Pretreatment for the etching which would have been heretofore needed is dispensed with. Also, it is not necessary to place and remove the mask. Hence, the efficiency of the exposure operation can be improved.

EMBODIMENTS

Embodiments of the invention are hereinafter described by referring to the drawings. FIGS. 1–9 show a first embodiment of the invention. The main portion of this embodiment comprises a board 31, upper and lower long arc-type discharge lamps 32 disposed in a symmetrical relation with respect to the board 31, upper and lower reflecting mirrors 33 of a given cross section which cover the rear sides of the discharge lamps 32, respectively, and are disposed in a symmetrical relation, an upper light condenser 34 disposed between the upper discharge lamp 32 and the board 31, and a lower light condenser 34b disposed between the lower discharge lamp 32 and the board 31 and spaced from the upper light condenser. The light condensers 34a and 34b can be moved forwardly and rearwardly as indicated by the arrows a in FIG. 1, in the vertical direction indicated by the arrows b in FIG. 1, and in the horizontal direction indicated by the arrows c in FIG. 2.

Figure 3:
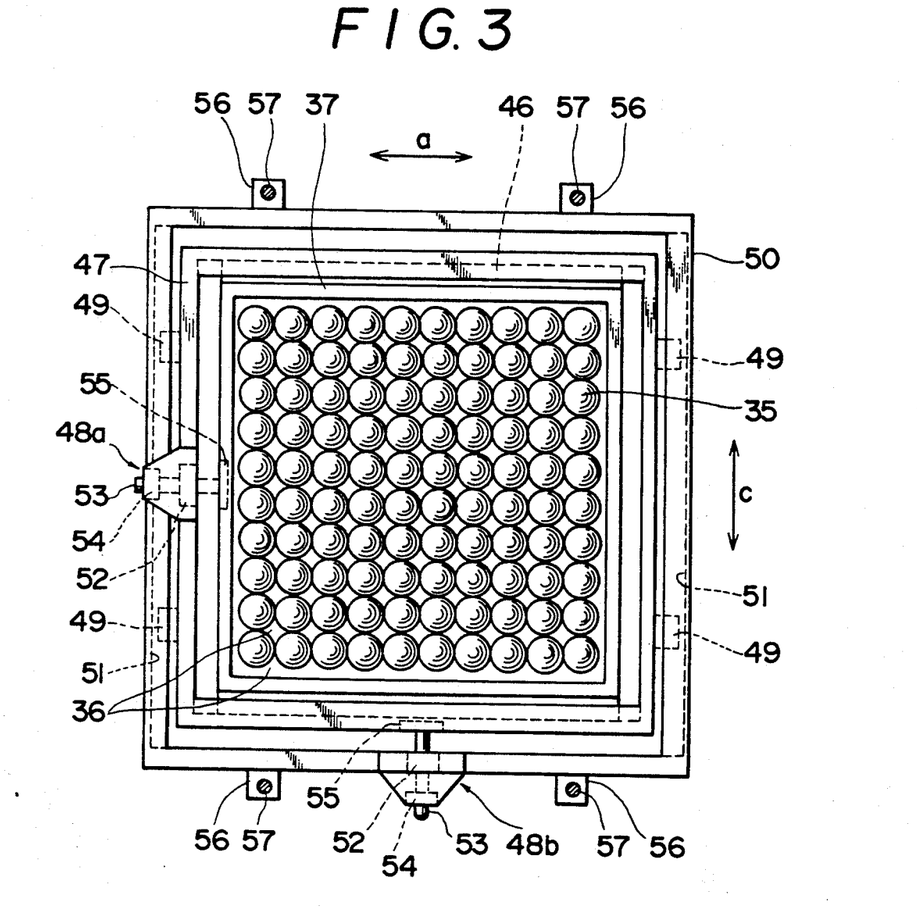
FIG. 3 is an enlarged view as viewed from the direction III—III of FIG. 1.

As shown in FIG. 3, each of the light condensers 34a and 34b comprises a multiplicity of adjacent lenses 35 arranged like a checkerboard and a fringe member 37 which holds the numerous lenses 35 inside it via a filler 36.

Figure 7:
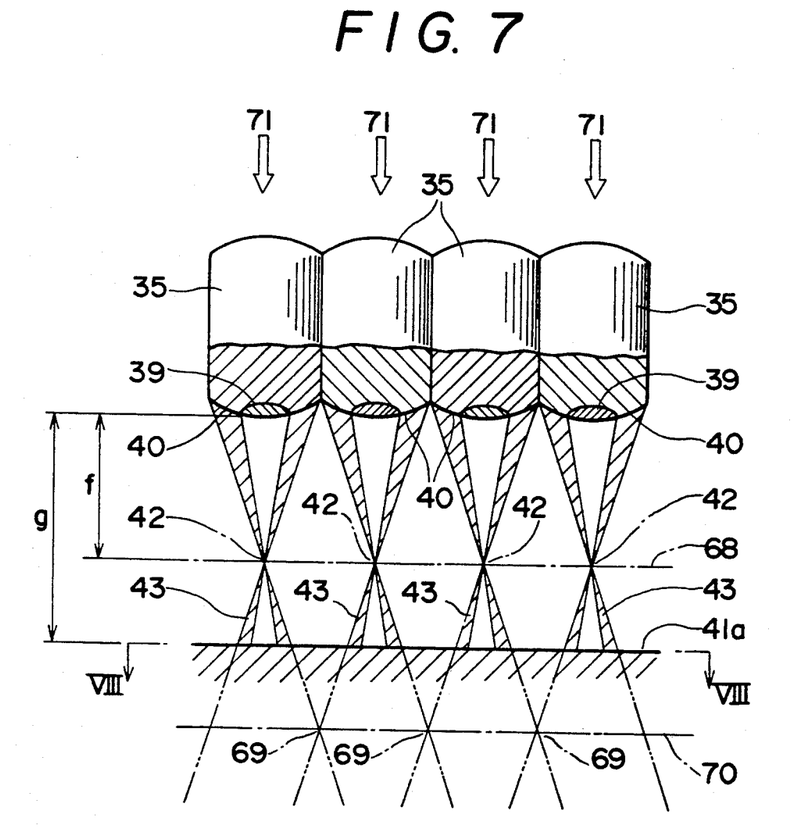
FIG. 7 is a partially cutaway enlarged view of the lenses shown in FIG. 6.
Figure 8:
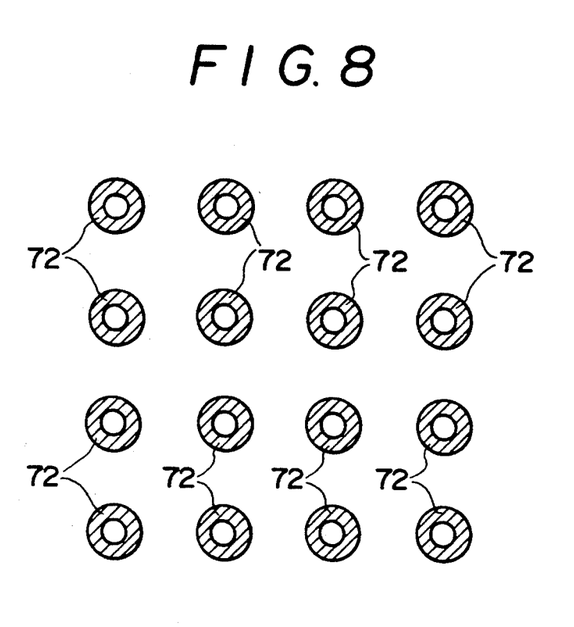
FIG. 8 is a view as viewed from the direction VIII—VIII of FIG. 7.

Each lens 35 is a cylindrical concave lens 10 to 20 mm in diameter. As shown in FIG. 7, a beadlike member 39 made of an opaque material is buried in the center of the lower surface, or the exit surface of the lens. Light passed through the lenses 35 exits from annular portions 40 surrounding the members 39, is focused at first foci 42, and then forms annular divergent light 43, i.e., diverges conically.

Figure 9:
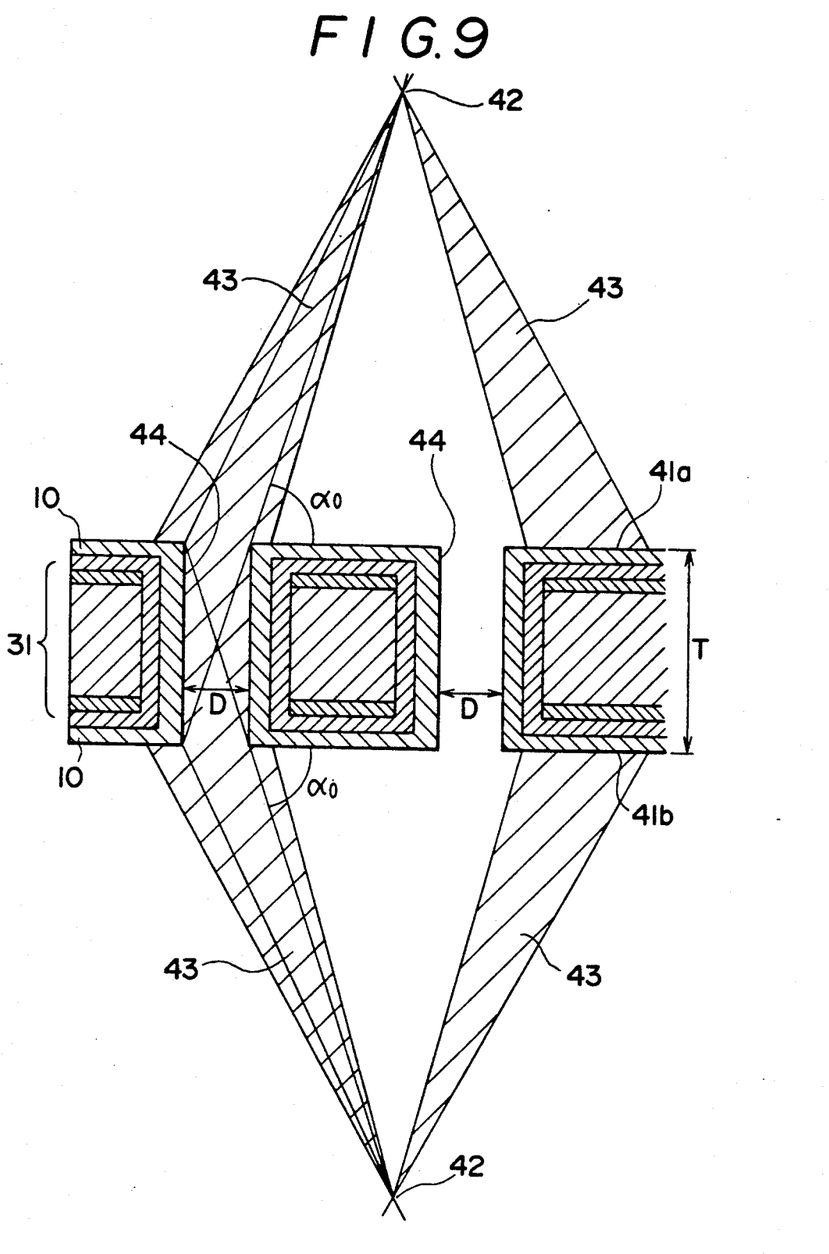
FIG. 9 is an enlarged view of the board portion shown in FIG. 6.

As shown in FIGS. 7 and 9, the focal length f of the lenses 35 is so set that the annular divergent light 43 enters the board 31 at the minimum tilt angle $\alpha_o$, i.e., arc tan T/D (hereinafter referred to as the given tilt angle) at which the light 43 can illuminate totally one side of the inner wall surface of each hole 44 having a depth T and an inside diameter D and at various tilt angles close to that tilt angle.

To facilitate the understanding, the lenses 35 are drawn to an exaggerated scale in FIGS. 1-3 and 6.

Figure 2:
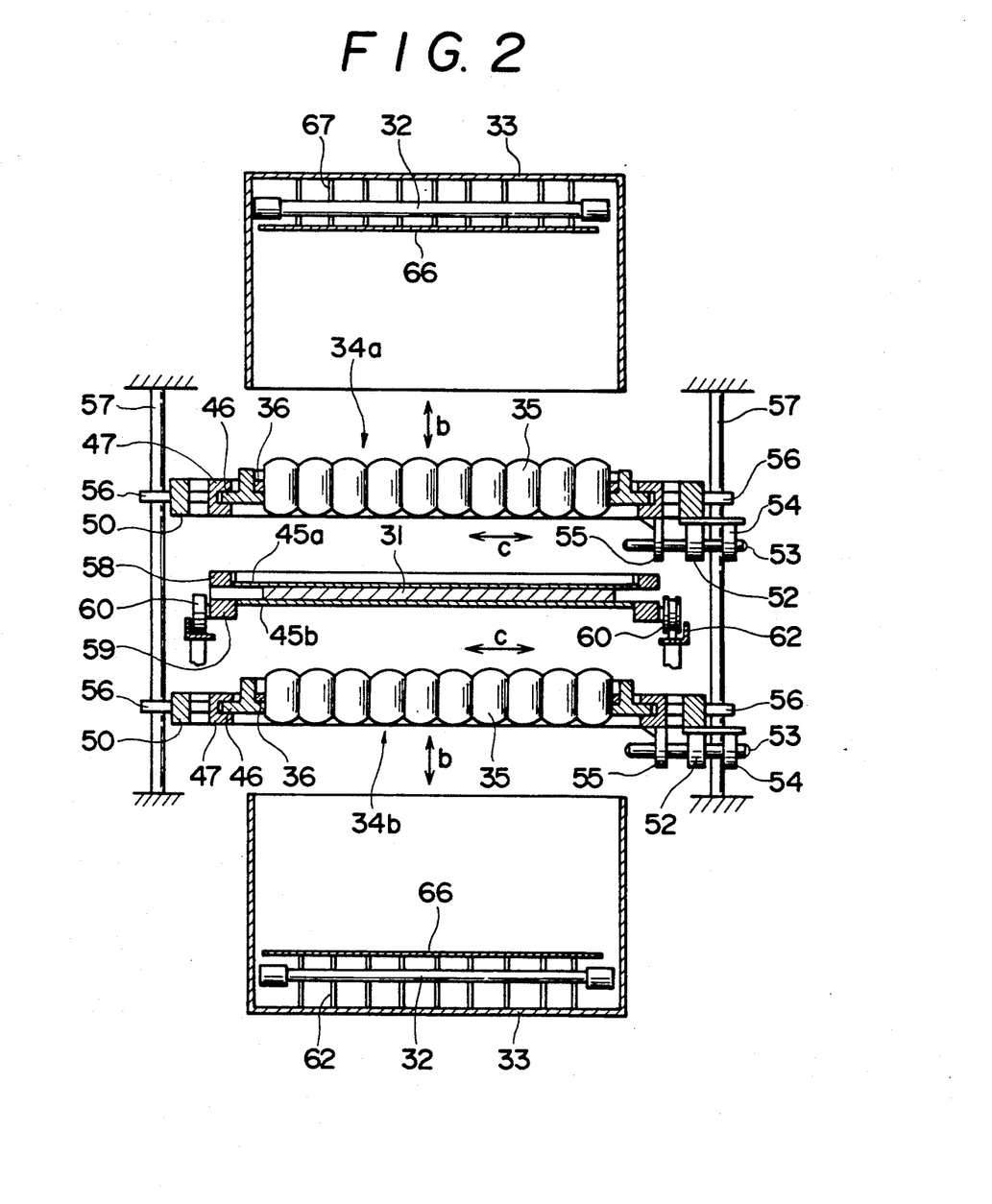
FIG. 2 is an enlarged view as viewed from the direction II—II of FIG. 1.

The lenses 35 are made of a transparent material that can be easily molded such as a resin that hardens when illuminated with light or acrylic material. However, acrylic materials are easily deteriorated by ultraviolet rays having shorter wavelengths less than 300 nanometers. Therefore, it is desired to dispose an optical filter (not shown) made of Pyrex glass and having an arc-shaped cross section close to each discharge lamp or to dispose an optical filter (not shown) taking the form of a flat plate between each discharge lamp and each light condenser. This prolongs the lives of the lenses 35, the life of the film for creating an image, and the lives of transparent plates 45a and 45b (described later). These transparent plates 45a and 45b are often made of an acrylic material To permit the light condensers 34a and 34b to move forwardly and rearwardly, the fringe member 37 is supported so as to be slid along guide grooves formed inside an inner frame member 47 via guide members 46 protruding right and left, respectively, as shown in FIG. 2. The fringe member is driven by a drive mechanism 48a (see FIG. 3) mounted between the fringe member 37 and the inner frame member 47.

Figure 1:
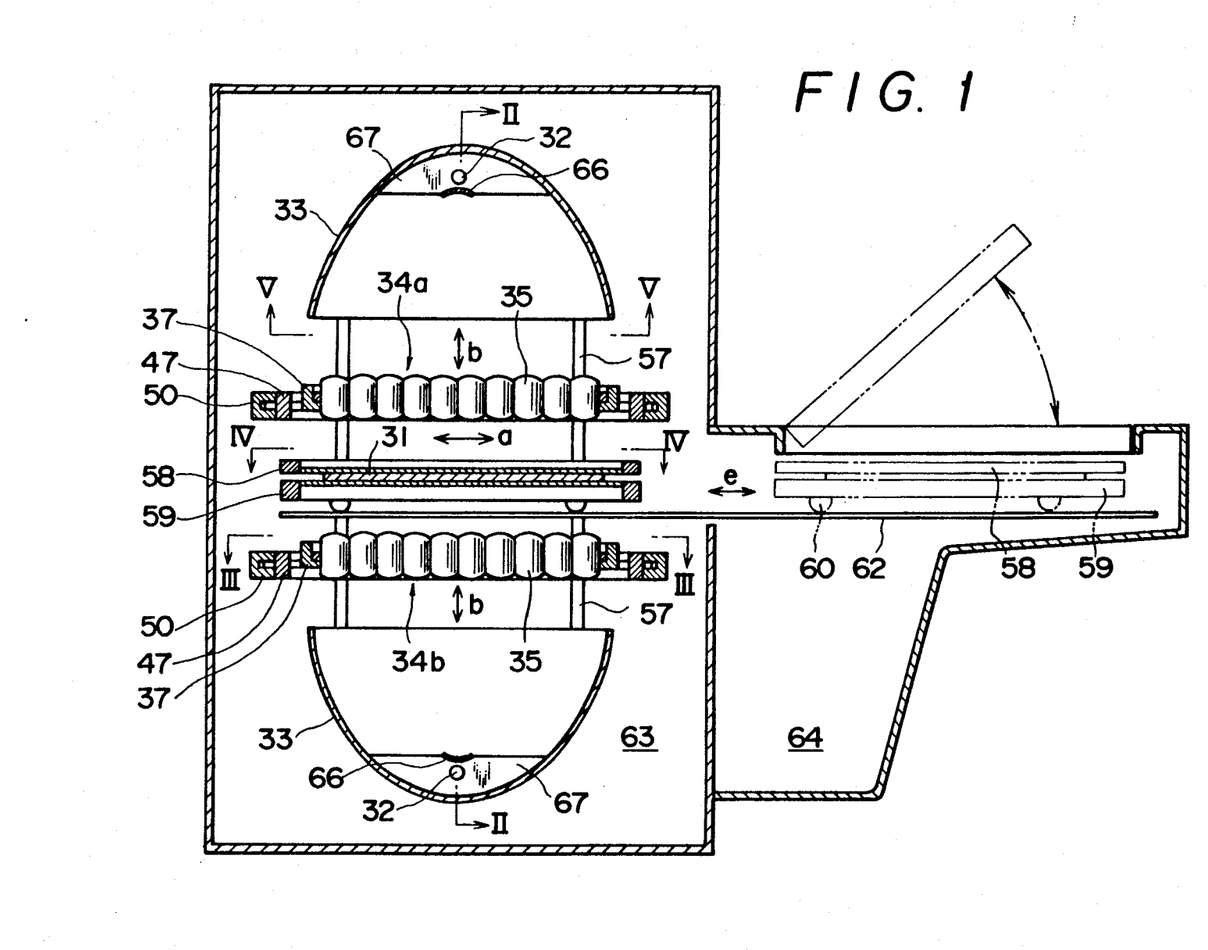
FIG. 1 is a side elevation in cross section of an exposure apparatus according to the invention, and in which the apparatus is placed sideways.

As shown in FIGS. 1 and 3, the inner frame member 47 is supported so as to be slid along guide grooves 51 formed inside an outer frame member 50 via four guide members 49 protruding forwardly and rearwardly of the inner frame member 47. This frame member 47 is driven horizontally as indicated by the arrows c by a drive mechanism 48b (see FIG. 3) mounted between the inner frame member 47 and the outer frame member 50.

The drive mechanisms 48a and 48b are similar in shape. Each drive mechanism is of a well-known construction using a screw mechanism. As shown in FIG. 2, each drive mechanism comprises a driven receiver member 52, a threaded rod 53 which is rotatably held to the receiver member 52 but cannot move back and forth, an electric motor 54 for rotating the threaded rod 53, and a threaded member 55 which is locked to the driving mechanism while kept in engagement with the threaded rod 53. When the threaded rod 53 is rotated, the threaded member 55 moves forwardly or rearwardly along the threaded rod 53 to drive the driven mechanism toward the threaded rod 53.

As shown in FIGS. 2 and 3, the outer frame member 50 is supported in such a way that it can be moved up and down along four guide poles 57 via four guide members 56 protruding laterally. The outer frame member 50 is driven up and down as indicated by the arrows b by a well-known drive mechanism (not shown) utilizing a screw mechanism.

Figure 4:
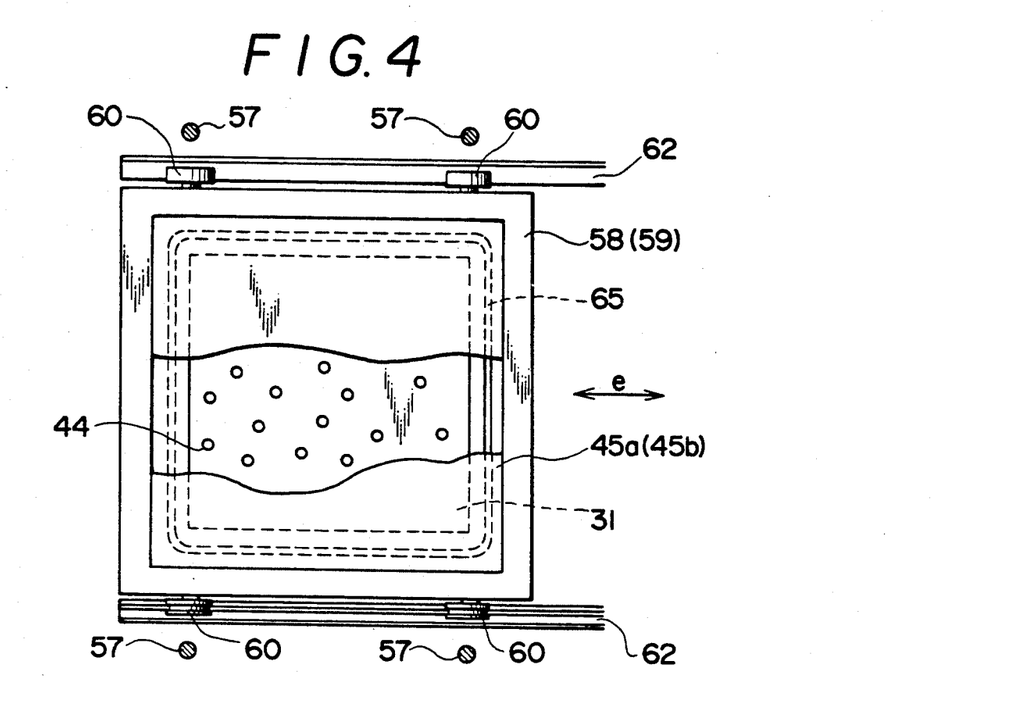
FIG. 4 is a partially cutaway view as viewed from the direction IV—IV of FIG. 1.
Figure 5:
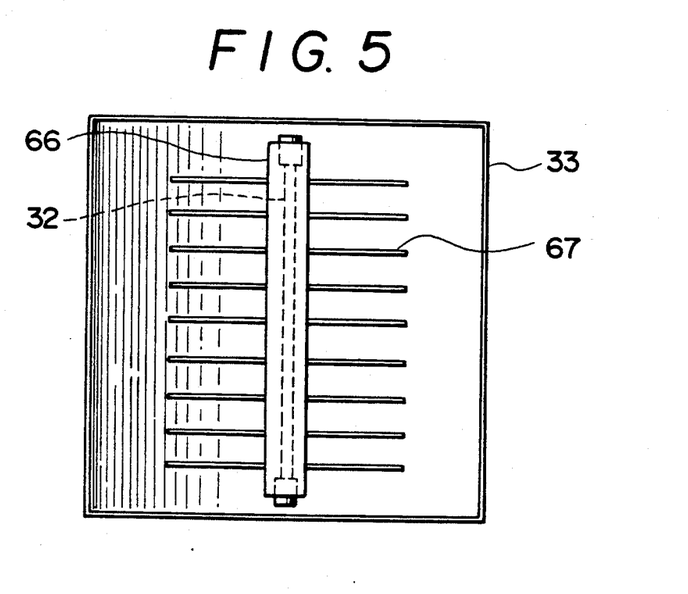
FIG. 5 is an enlarged view as viewed from the direction V—V of FIG. 1.

The board 31 is square or rectangular in shape. As shown in FIG. 4, a multiplicity (several to ten thousands) of holes 44 are formed over the whole surface of the board 31, the holes extending through it vertically. The board 31 is sandwiched between the transparent plates 45a and 45b mounted to an upper printing frame 58 and a lower printing frame 59 via film (not shown) for creating an image, as shown in FIG. 2. The board is reciprocated in the direction indicated by the arrows e of FIG. 1 between an exposure station 63 and an operation portion 64 via four rotating wheels 60 mounted to the lower printing frame 59 and via two sliding rails 62. In FIG. 4, a sealing bank member 65 of rubber protrudes upright from the lower transparent plate 45b so as to surround the board 31. During the exposure, the flat space surrounded by the rubber bank member 65 and by the upper transparent plate 45a and the lower transparent plate 45b is depressurized as is well known in the art to bring the image formation film (not shown) into intimate contact with the surface of the board 31.

The reflecting mirrors 33 are parabolic in cross section. The discharge lamps 32 are disposed at the foci of the parabolic planes. In FIG. 1, shades 66 prevent the ultraviolet rays emitted from the discharge lamps 32 from directly entering the board 31. A louver board 67 directs the ultraviolet rays emitted from the discharge lamps 32 perpendicularly to the axes of the lamps 32.

The manner in which the apparatus of the present example is handled and the operation are next described. First, the board 31 is placed in the operation portion 64. Instead of the board 31, an appropriate number of illumination photometers (not shown) are placed in the exposure position in such a way that they face upward and down. The upper and lower discharge lamps 32 emit ultraviolet rays. Then, the upper light condenser 34 is moved upward or downward along the four guide poles 57. A level 68 at which the first foci 42 of the upper lenses 35 are distributed and a level 70 at which the second foci 69 formed by four adjacent lenses are distributed are detected while measuring the readings of the illumination photometers facing upward. The distance g between the upper light condenser 34 and the board 31 is so set that the upper surface 41 of the board 31 is located substantially midway between the levels 68 and 70. Similar operations are performed for the lower light condenser 34b to set the distance from the board 31.

Thus, the preparations are completed. Then, an exposure operation is effected.

Figure 6:
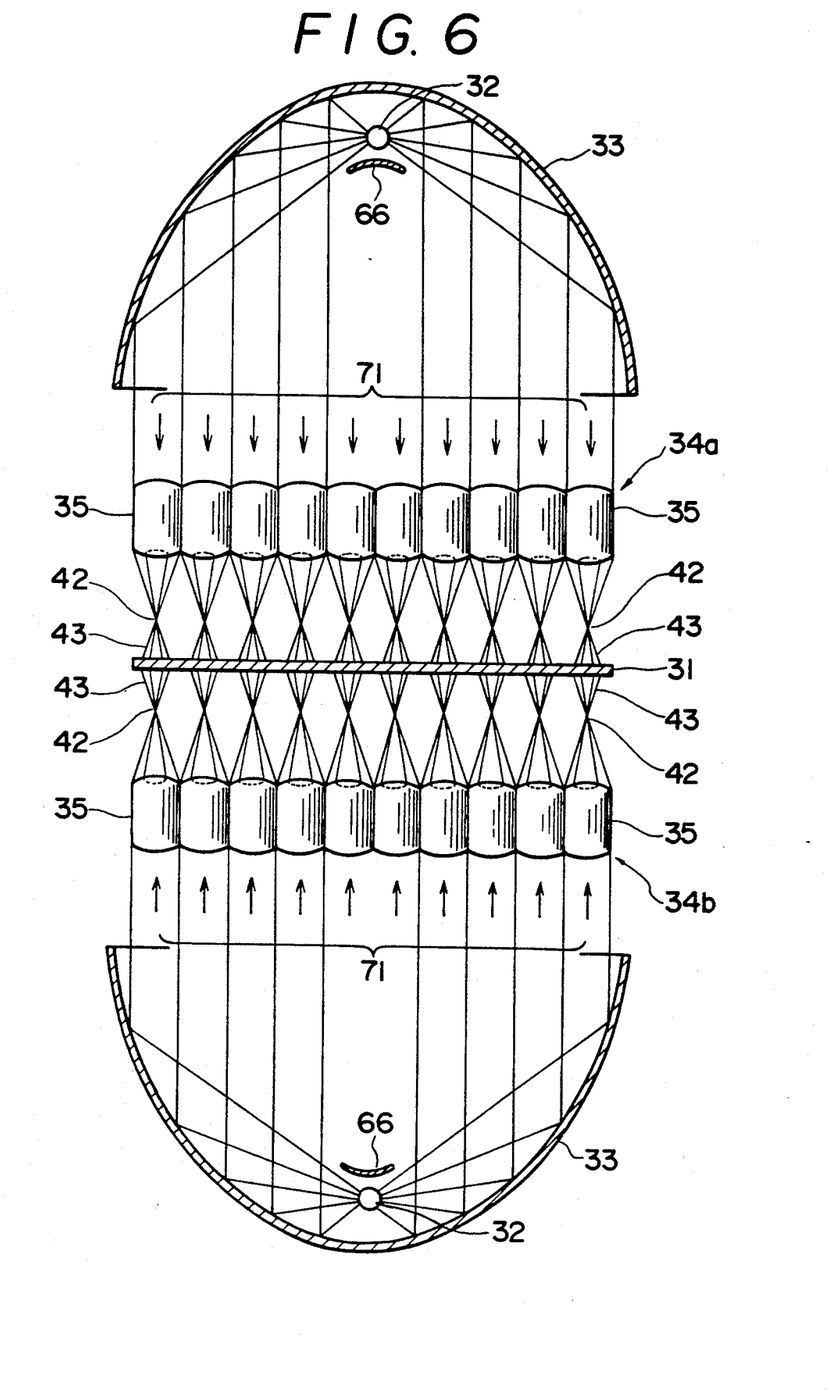
FIG. 6 is a side elevation in cross section, illustrating the operation of the apparatus shown in FIG. 1.

During the exposure, most of the ultraviolet rays emitted from the upper and lower discharge lamps 32 are reflected by the upper and lower reflecting mirrors 33 as shown in FIG. 6, then collimated as indicated by the arrows 71, and enter the upper light condenser 34 and the lower light condenser 34b. The incident light passes through the lenses 35 and is focused at the first foci 42. Then, the light forms an annular cross section and diverges conically. The diverging light rays 43 enter the board 31 at the given tilt angle $\alpha_o$ and at various angles close to it to harden the electro-deposited photoresist inside the holes located at the incident locations 72 (hatched portions in FIG. 8) and on the surface of the board.

The drive mechanisms 48a and 48b are driven to move the upper light condenser 34 and the lower light condenser 34b forwardly and rearwardly as indicated by the arrows a and horizontally as indicated by the arrows c. By these operations, the location 72 at which the divergent light rays 43 enter shifts along the surface of the board 31. As a result, the electrodeposited photoresist inside the holes and on the surface of the board which have not been illuminated is hardened.

In this way, the light condensers 34a and 34b are moved in a stepwise fashion to illuminate the whole board 31 uniformly with the ultraviolet rays. As a result, the exposure is completed.

In the description made above, the distance g between the board 31 and each of the upper light condenser 34a and the lower light condenser 34b is set at the midpoint between the levels 68 and 70. Instead, the value of g can be set slightly larger. In this case, the extent of the locations 72 at which the divergent light rays 43 enter can be increased further. Consequently, the distance traveled by the light condensers 34a and 34b and the number of steps of movement can be decreased.

The manner in which the light rays 43 diverging annularly from the upper and lower first foci 42 illuminate the inside of the holes 44 and the surface of the board 31 is drawn to an exaggerated scale in FIG. 9. Since the upper and lower diverging light rays 43 indicated by the hatching enter the holes at the given angle $\alpha_o$ and at various angles close to it, one side of the inner wall surface of each hole is hardened substantially uniformly.

On the other hand, the electrodeposited photoresist on the upper and lower surfaces 41a and 41b, respectively, of the board is illuminated with either of the divergent light 43 coming from above or the divergent light 43 coming from below and becomes hardened substantially uniformly.

Overexposure and underexposure of the electrodeposited photoresist inside the holes and on the surface of the board are next discussed.

As already described in conjunction with FIG. 14, when the ultraviolet rays enter the board at the same tilt angle $\alpha$, the photoresist on the surface of the board receives a light amount $\tan\alpha$ times as the amount of light that the photoresist inside the holes receives. In accordance with the present invention, the inside of the holes is exposed by the divergent light 43 coming from above and below. The surface of the board is exposed by either the divergent light 43 coming from above or by the divergent light 43 coming from below. Therefore, where the electrodeposited photoresist inside the holes is exposed normally, the board surface receives a light amount $\frac{1}{2}\cdot\tan\alpha$ times as large as the light amount that the photoresist inside the holes receives.

The maximum overexposure which will not impede the subsequent steps such as development is 3 to 4 times as large as the normal amount of exposure. Today, the normal amount of exposure for the electrodeposited photoresist is 150 to 200 millijoules. The maximum tolerable overexposure is 600 to 700 millijoules. For example, if the amount of exposure inside the holes is set to 150 millijoules, and if the amount of exposure on the surface of the board is set to 600 millijoules, then the board with the inside diameter of the holes exceeding 0.2 mm can be exposed appropriately within a practically acceptable range provided that $\frac{1}{2}\cdot\tan\alpha=4$, i.e., the thickness of the board is 1.6 mm.

Figure 10:
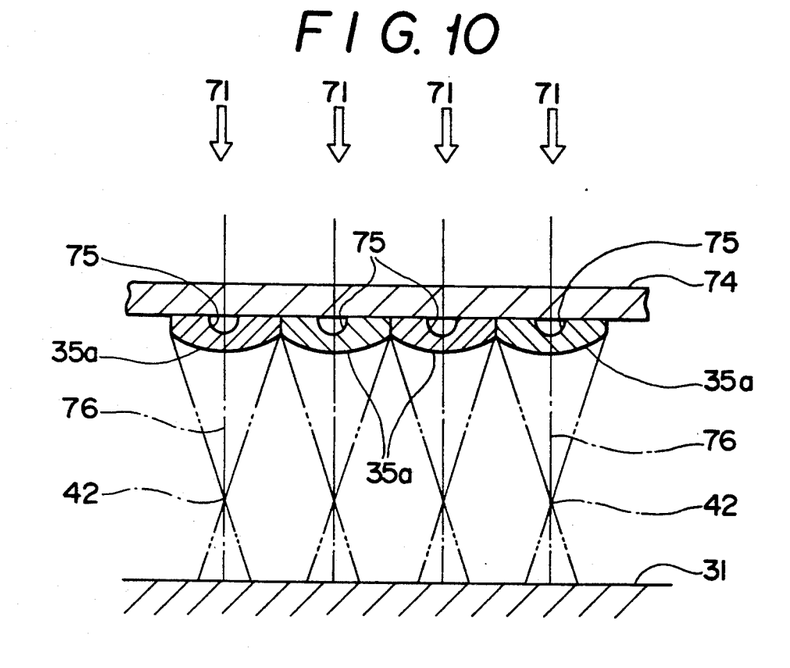
FIG. 10 is a cross-sectional view of a light condenser of another apparatus according to the invention, corresponding to FIG. 7.

A second embodiment of the invention is shown in FIG. 10. This example is similar to the first embodiment except that flat spherical lenses 35 are used instead of the pillar-shaped lenses. The spherical lenses 35 are mounted to the underside of a flat rectangular filter 74 close to the board 31 in a close relation to each other. An opaque material (not shown) which blocks light fills in the gaps between the spherical lenses 35.

A recess 75 is formed in the center of each spherical lens 35a. This recess 75 acts to scatter the light incident on the center of each spherical lens 35a or to diverge the light emerging from the center of each lens, thus reducing the intensity of the outgoing light close to the optical axis 76 of each lens. The recess plays substantially the same role as the opaque material 39 of the first embodiment.

The recess 75 may be formed on the exit side of each spherical lens 35a instead of on the incident side.

The optical filter 74 serves to remove deleterious light (infrared light or ultraviolet rays having shorter wavelengths less than 300 nanometers) from the illuminating light. If necessary, the filter may be made of plural layers of various materials.

Figure 11:
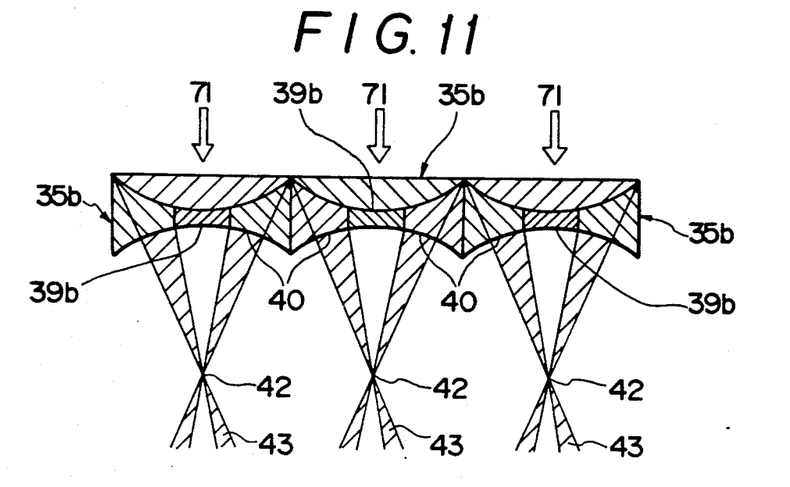
FIG. 11 is a partially cutaway side elevation of other modifications of the lenses shown in FIG. 7.

Modifications of the lenses of the first example are shown in FIG. 11. These modifications are similar to the lenses of the first example except that a disklike opaque portion 39b is formed in the center of each lens 35b absorbing the chromatic aberration.

It is to be understood that the present invention is not limited to above embodiments and that various changes and modifications may be made without departing from the spirit and the scope of the present invention. For example, each ultra-violet illumination device may be a combination of a spot light source (short arc discharge lamp) and a parabolic reflecting mirror having a two-dimensional shape that is symmetrical about a point. The board may be placed closer to the light condensers than the first foci to direct converging light to the board instead of divergent light.

Effects of the Invention

As described above, the present invention yields the following advantages.

(1) Since conical light passed through the lenses enter the board obliquely from above and below at the given tilt angle and at various angles close to it, the electrodeposited photoresist on the surface of the board and inside the holes can be adequately hardened without overexposure or underexposure.

(2) If the light condensors are moved horizontally, the electrodeposited photoresist on the whole surface of the board and inside every hole can be totally hardened. This prevents deteriorations in the manufacturing quality.

(3) As a result of (1) and (2) above, the electro-deposited photoresist on the surface of the board and in the holes can be continuously exposed. Pretreatment for the etching which would have been heretofore needed is dispensed with. Also, placement and detachment of masks are unnecessary. Consequently, the efficiency of the exposure operation can be improved.

What is claimed is:

1. An exposure apparatus adapted to create an image on the surface of a board by directing ultraviolet radiation to the board via film used for creating an image and producing a photochemical reaction in electrodeposited photoresist on the surface of the board and on the inner wall surfaces of holes extending through the board, said apparatus comprising:

an upper ultraviolet illumination device having a discharge lamp and a reflecting mirror and located above the board;

a lower ultraviolet illumination device halving a discharge lamp and a reflecting mirror and located below the board, the upper and lower ultraviolet illumination devices being spaced apart from each other vertically in a symmetrical relation;

a horizontally movable upper light condenser consisting of a horizontal array of a number of lenses placed close to each other, the upper light condenser being located between the discharge lamp of the upper ultraviolet illumination device and the board;

a horizontally movable lower light condenser consisting of a horizontal array of a number of lenses placed close to each other, the lower light condenser being located between the discharge lamp of the lower ultraviolet illumination device and the board, the lower light condenser being spaced from the upper light condenser;

the lenses being optically arranged in such a way that the ultraviolet radiation incident on the lenses forms conical outgoing light surrounding the optical axes of the lenses.

* * * * *